United States Patent
Ma et al.

(10) Patent No.: US 9,425,351 B2
(45) Date of Patent: Aug. 23, 2016

(54) HYBRID HETEROSTRUCTURE LIGHT EMITTING DEVICES

(71) Applicant: Wisconsin Alumni Research Foundation, Madison, WI (US)

(72) Inventors: Zhenqiang Ma, Middleton, WI (US); Jung-Hun Seo, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 113 days.

(21) Appl. No.: 14/506,975

(22) Filed: Oct. 6, 2014

(65) Prior Publication Data

US 2016/0204306 A1    Jul. 14, 2016

(51) Int. Cl.
| | | |
|---|---|---|
| *H01L 33/06* | (2010.01) | |
| *H01L 33/00* | (2010.01) | |
| *H01L 33/28* | (2010.01) | |
| *H01L 27/15* | (2006.01) | |
| *H01L 31/0328* | (2006.01) | |
| *H01L 21/283* | (2006.01) | |

(52) U.S. Cl.
CPC ............ *H01L 33/06* (2013.01); *H01L 33/0083* (2013.01); *H01L 21/283* (2013.01); *H01L 27/156* (2013.01); *H01L 31/0328* (2013.01); *H01L 33/0008* (2013.01); *H01L 33/0016* (2013.01); *H01L 33/28* (2013.01)

(58) Field of Classification Search
CPC ..... H01L 33/06; H01L 33/0083; H01L 33/28; H01L 33/406; H01L 33/0008; H01L 33/32; H01L 33/641; H01L 33/642; H01L 33/0095; H01L 29/1602; H01L 27/156; H01L 21/283
USPC .......................................................... 257/13
See application file for complete search history.

(56) References Cited

U.S. PATENT DOCUMENTS

| | | | |
|---|---|---|---|
| 4,590,501 A | * | 5/1986 | Scholl ................. H01L 33/0008 257/103 |
| 6,881,988 B2 | | 4/2005 | Niwa et al. |
| 7,030,428 B2 | | 4/2006 | Saxler |
| 7,354,809 B2 | | 4/2008 | Yuan et al. |
| 7,777,290 B2 | | 8/2010 | Lagally et al. |
| 8,217,410 B2 | | 7/2012 | Ma et al. |

(Continued)

FOREIGN PATENT DOCUMENTS

| | | |
|---|---|---|
| GB | 2453464 | 4/2009 |
| JP | 2005-512327 | 4/2005 |

(Continued)

OTHER PUBLICATIONS

Gui et al., The effect of surface roughness on direct wafer bonding, Journal of Applied Physics, vol. 85, No. 10, May 15, 1999, pp. 7448-7454.

(Continued)

*Primary Examiner* — Nathan Ha
(74) *Attorney, Agent, or Firm* — Bell & Manning, LLC

(57) ABSTRACT

Light-emitting devices having a multiple quantum well (MQW) pin diode structure and methods of making and using the devices are provided. The devices are composed of multilayered semiconductor heterostructures. The devices include one or more interfacial layers of a material that allows current tunneling through lattice mismatched heterogeneous junctions at the interfaces between the intrinsic active region and the p-type and/or n-type doped charge injection layers.

20 Claims, 8 Drawing Sheets

(56) References Cited

U.S. PATENT DOCUMENTS

| | | |
|---|---|---|
| 8,227,789 B2 | 7/2012 | Hirayama et al. |
| 8,232,617 B2 | 7/2012 | Ma et al. |
| 8,865,489 B2 | 10/2014 | Rogers et al. |
| 2003/0032253 A1 | 2/2003 | Nguyen et al. |
| 2004/0164319 A1 | 8/2004 | Zampardi et al. |
| 2005/0218428 A1 | 10/2005 | Bahl et al. |
| 2006/0086932 A1 | 4/2006 | Kim et al. |
| 2006/0121682 A1 | 6/2006 | Saxler |
| 2006/0180830 A1 | 8/2006 | Alavi et al. |
| 2011/0027921 A1* | 2/2011 | Hamasaki ............ H01L 33/0095 438/26 |
| 2013/0214303 A1* | 8/2013 | Kinoshita ............... H01L 33/14 257/88 |
| 2013/0234168 A1* | 9/2013 | Kinoshita ............. H01L 27/153 257/88 |
| 2013/0277642 A1 | 10/2013 | Kneissl et al. |
| 2014/0264375 A1 | 9/2014 | Ma et al. |
| 2015/0255670 A1* | 9/2015 | Furuyama ............... H01L 33/06 257/13 |

FOREIGN PATENT DOCUMENTS

| | | |
|---|---|---|
| JP | 2007-103689 | 4/2007 |
| JP | 4959693 | 6/2012 |
| KR | 10-2003-0063075 | 7/2003 |
| KR | 10-2005-0081207 | 8/2005 |
| KR | 10-2006-0036713 | 5/2006 |
| KR | 10-2007-0063912 | 6/2007 |

OTHER PUBLICATIONS

Chen et al., Epitaxially oriented growth of diamond on silicon by hot filament chemical vapor deposition, Appl. Phys. Lett., vol. 68, No. 2, Jan. 8, 1996, pp. 176-178.

Barnett et al., 50% Efficient Solar Cell Architectures and Designs, Conference Record of the 2006 IEEE 4th World Conference on Photovoltaic Energy Conversion, Waikoloa, HI, May 7-12, 2006, pp. 2560-2564.

International Search Report and Written Opinion issued in PCT/US2014/011569, May 20, 2014.

Intl. Search Report & Written Opinion for Intl. Patent Appl. No. PCT/US2015/054018, mailed on Feb. 11, 2016, 11 pages.

\* cited by examiner

HYBRID HETEROSTRUCTURE LIGHT EMITTING DEVICES

REFERENCE TO GOVERNMENT RIGHTS

This invention was made with government support under FA9550-09-1-0482 awarded by the USAF/AFOSR. The government has certain rights in the invention.

BACKGROUND

Conventionally, epitaxially grown heterostructures are used to create certain light-emitting devices, including pin diodes having a multiple quantum well structure in their active region. For devices fabricated from group III-V semiconductor materials, such as GaN, limitations on the highest achievable doping concentrations in the p-type semiconductor of the hole injection layer limit the hole injection efficiency and, thus, the internal quantum efficiency of the devices. In addition, the low mobility of holes in the p-type doped III-V semiconductor materials leads to the need for a high bias to operate the devices. These issues are particularly severe for nitride semiconductor-based devices that are used for blue and UV light generation, since the hole mobility and concentration of activated p-type dopants tend to be particularly low in p-type doped GaN based semiconductors.

SUMMARY

Light-emitting devices having a multiple quantum well (MQW) pin diode structure and methods of making and using the devices are provided.

One embodiment of a light-emitting device comprises: a hole injection layer comprising a single-crystalline p-type doped semiconductor material; an electron injection layer comprising a single-crystalline n-type doped semiconductor material; a light-emitting active region comprising intrinsic semiconductor materials disposed between the hole injection layer and the electron injection layer, the light-emitting active region comprising a multiple quantum well structure comprising alternating barrier layers and quantum well layers; and a current tunneling layer disposed between, and in contact with, the hole injection layer and the light-emitting active region or between, and in contact with, the electron injection layer and the light-emitting active region. The current tunneling layer comprises an inorganic material having a bandgap that is wider than the bandgaps of the doped semiconductor material and the intrinsic semiconductor material with which it is in contact. The interface between the current tunneling layer and the doped semiconductor material and the interface between the current tunneling layer and the intrinsic semiconductor material do not have an epitaxial structure.

One embodiment of a method of making a light-emitting device comprises providing a multilayered semiconductor heterostructure comprising: an electron injection layer comprising a single-crystalline n-type doped semiconductor material; and a light-emitting active region comprising intrinsic semiconductor materials on the electron injection layer, the light-emitting active region comprising a multiple quantum well structure comprising alternating barrier layers and quantum well layers. Then, depositing a current tunneling layer on the light-emitting active region; transferring a hole injection layer comprising single-crystalline p-type doped semiconductor material onto the current tunneling layer; and bonding the hole injection layer to the current tunneling layer. The current tunneling layer comprises an inorganic material having a bandgap that is wider than the bandgaps of the p-type doped semiconductor material and the intrinsic semiconductor material with which it is in contact. The interface between the current tunneling layer and the p-type doped semiconductor material and the interface between the current tunneling layer and the intrinsic semiconductor material do not have an epitaxial structure. The transfer and bonding of the hole injection layer to the current tunneling layer may be carried out using a thin film release and transfer method or by wafer bonding following by thin film cleavage.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

DETAILED DESCRIPTION

Figure 1:
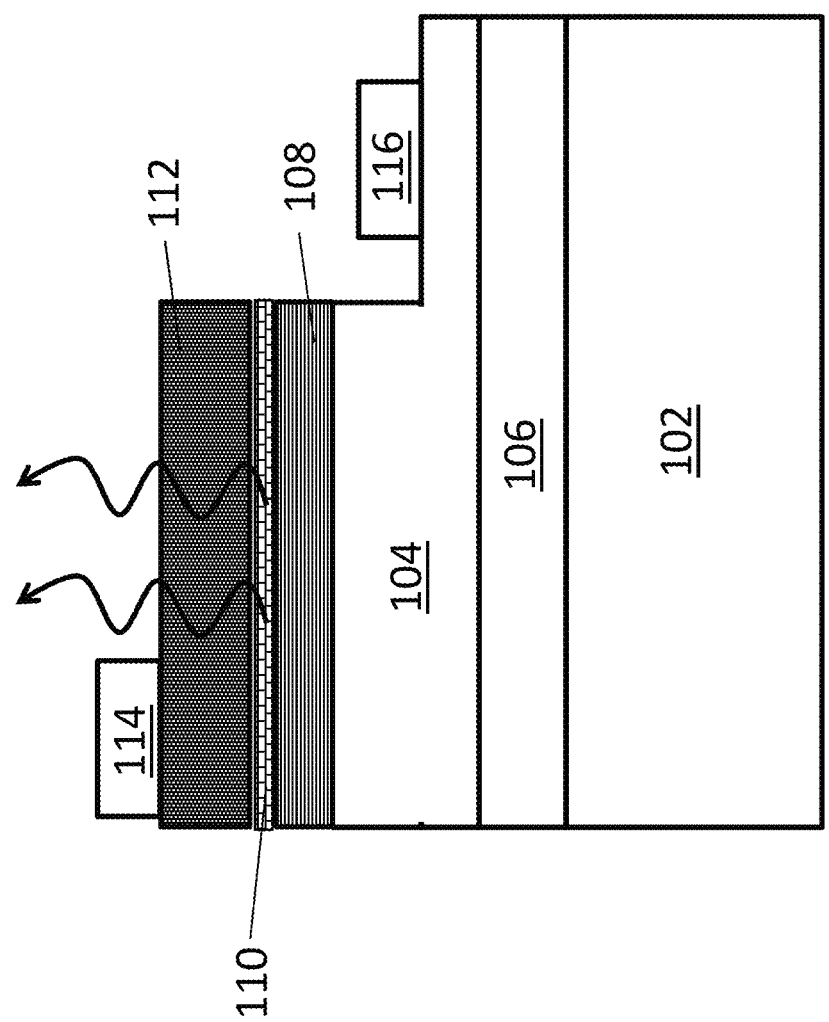
FIG. 1 is a schematic diagram of a light-emitting diode.

Light-emitting devices having a multiple quantum well (MQW) pin diode structure and methods of making and using the devices are provided.

The devices are fabricated using a thin film transfer and bonding process or an interfaced bonding process in combination with the introduction of one or more interfacial current tunneling layers to create high-performance light-emitting devices in which the doped semiconductor materials of the p-type and n-type layers of the pin heterojunction can be selected independently from the intrinsic semiconductor materials of the intrinsic active region.

The devices are composed of multilayered semiconductor heterostructures in which layers of a material that allows current tunneling through lattice mismatched heterogeneous junctions are provided at the interfaces between the intrinsic active region and the p-type and/or n-type doped charge injection layers. Using this design, many materials can be put together to form hybrid heterostructures regardless of their lattice and/or thermal mismatch.

Because the transfer and bonding processes do not rely upon epitaxial growth or wafer bonding, the materials in the charge injection layers need not be lattice matched with the semiconductor materials of the active region. In addition, unlike wafer bonding techniques, the transfer and bonding process and the interfaced wafer bonding process do require atomically smooth surfaces for bonding and can tolerate relatively large differences in the coefficients of thermal expansion for the doped and undoped semiconductor materials in the heterojunction. Finally, because the p-type and/or n-type doped injection layers are physically separated from the intrinsic active region by a current tunneling layer, chemical reactions between the materials are avoided and the surfaces of the materials may be passivated. As a result, the light-emitting devices can be fabricated from a much wider range of semiconductor materials than those made from epitaxial growth or wafer bonding techniques.

The pin diode structure of a light-emitting device comprises a hole injection layer comprising a single-crystalline p-type doped semiconductor material, such as a p-type doped narrow bandgap group IV semiconductor or a narrow bandgap group III-V semiconductor; an electron injection layer comprising a single-crystalline n-type doped semiconductor material; and a light-emitting active region disposed between the hole injection layer and the electron injection layer. A current tunneling layer is disposed between one or both of the charge injection layers and the intrinsic active region.

The intrinsic active region includes a MQW structure comprising alternating barrier and quantum well layers, which are made of different semiconductor materials. In the MQW structures, charge carriers are confined via quantum confinement in thin layers of one semiconductor "well" material sandwiched between layers of other semiconductor "barrier" materials. The active region may further comprise a lower spacer layer and an upper spacer layer between which the MQW structure is disposed. The spacer layers are used to increase the thickness of the intrinsic active region and, because they form part of the intrinsic active region, they are comprised of undoped single-crystalline semiconductor materials. In embodiments of the devices that include spacer layers in the active region, the current tunneling layer will be disposed between, and in contact with, a spacer layer and its neighboring charge injection layer. In the absence of spacer layers, the current tunneling layer will be adjacent to, and in contact with, the outermost barrier layer of the MQW structure. The barrier layers, quantum well layers and spacer layers can comprise group III-V or group II-VI semiconductor materials.

The current tunneling layer is formed of an inorganic material having a bandgap that is wider that the bandgaps of the doped semiconductor material of the charge injection layer and the intrinsic semiconductor material of the active region with which it is in contact. In this structure, the single-crystalline p-type or n-type doped semiconductor material has a different chemical composition and a different lattice constant than the intrinsic semiconductor materials.

As used herein, the term "current tunneling layer" refers to a layer characterized in that it is made from an appropriate material and is sufficiently thin that it is able to act as a tunneling layer for electrons and/or holes. That is, unlike a typical dielectric medium, it allows both electrons and holes to pass through it, from a first layer to a second layer of single-crystalline semiconductor material, via quantum tunneling. Thus, because metals would block the passage of holes, metals are not suitable materials for a current tunneling layer. However, a wide range of non-metal inorganic materials can meet these criteria. The inorganic material of the current tunneling layer may be a material that would act as a dielectric in its bulk form, but is sufficiently thin that it no longer acts as an electrical insulator. The current tunneling layer provides a sort of 'glue' between layers of single-crystalline semiconductor material. It is able to conform to the topography of the surfaces of the layers of semiconductor materials without introducing voids at the interfaces. In addition, the current tunneling layer can prevent the interdiffusion of the semiconductor materials from the neighboring layers of single-crystalline semiconductor materials. This avoids the formation of an unwanted, intervening, cross-contaminated semiconductor interface layer between layers of single-crystalline semiconductor.

Other advantages provided by this layer of inorganic material are that it can passivate the surfaces of the layers of semiconductor materials with which it is in contact, such that dangling bonds and interface states are minimized or eliminated. This property is useful because, when directly bonding two non-lattice matched single-crystalline materials, the chemical bonds formed between the two materials can create a large number of interface states. These interface states prevent the two materials from forming ideal rectifying junctions. However, when the inorganic material is inserted the two materials are physically separated. If the layer is sufficiently thin and has the capability to chemically passivate the materials, the number of interface states can be reduced to levels such that both electrons and holes can efficiently tunnel through the layer.

Other components that may be part of the light-emitting devices are those commonly incorporated into such devices, including a substrate, buffer layers, cladding layers, reflectors, electrically conductive contact layers, electrodes and interconnects. For example, the devices may further comprise electrodes in electrical communication with the p-type and n-type doped semiconductor materials and a voltage source configured to apply a voltage across the pin junction.

Light-emitting diodes (LEDs) are examples of light-emitting devices that can include the MQW pin diode structures. A schematic diagram of an LED is provided in FIG. 1. The LED includes a substrate 102 and an electron injection layer 104 comprising an n-type doped semiconductor material. In this embodiment, substrate 102 is a growth substrate upon which the electron injection layer 104 is epitaxially grown and, therefore, further includes a buffer layer 106 to facilitate the epitaxial growth of the semiconductor material of the electron injection layer over the substrate material, as those materials do not have a perfect lattice match. Active region 108 comprising a MQW structure is disposed on electron injection layer 104 and a layer of current tunneling material 110 is disposed on active region 108. A p-type doped layer of semiconductor material provides the hole injection layer 112 and completes the pin diode structure. An anode 114 and a cathode 116 are placed in electrical communication with the hole and electron injection layers, respectively.

Figure 2:
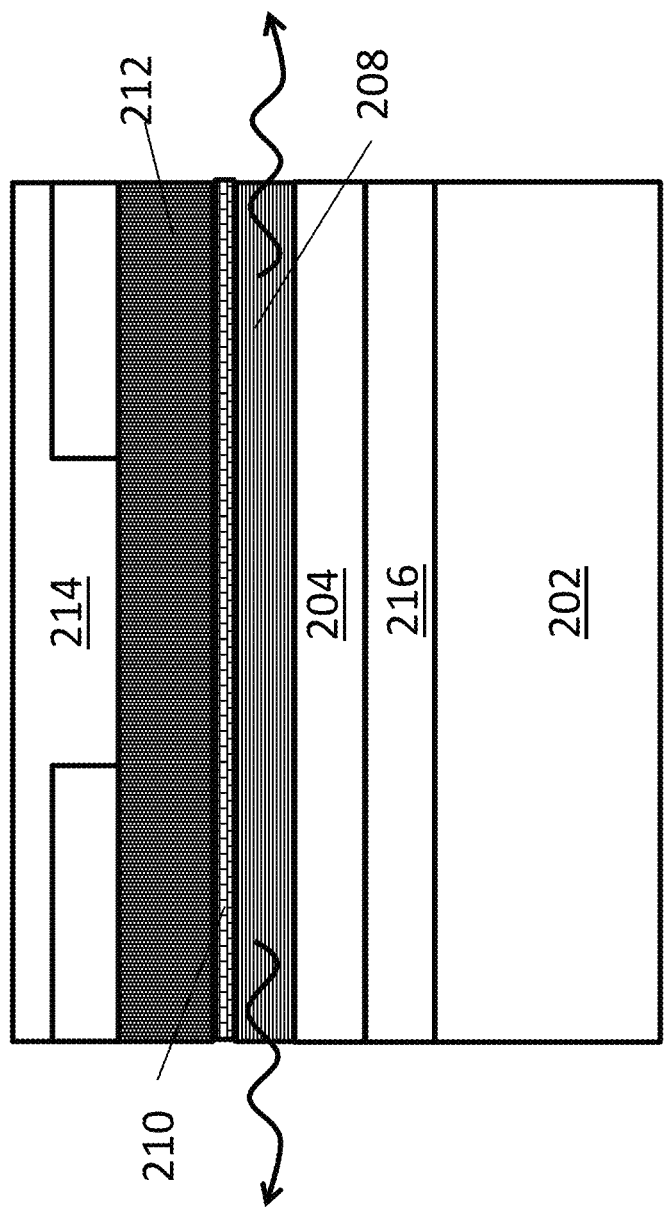
FIG. 2 is a schematic diagram of an edge-emitting laser.

The MQW pin diode structures can also be incorporated into an edge-emitting laser, as shown schematically in FIG. 2. The edge-emitting laser includes a substrate 202 an electron injection layer 204 comprising an n-type doped semiconductor material. Active region 208 comprising a MQW structure is disposed on electron injection layer 204 and a layer of current tunneling material 210 is disposed on active region 208. A p-type doped layer of semiconductor material provides the hole injection layer 212 and completes the pin diode structure. An anode 214 and a cathode 216 are placed in electrical communication with the hole and electron injection layers, respectively.

Figure 3:
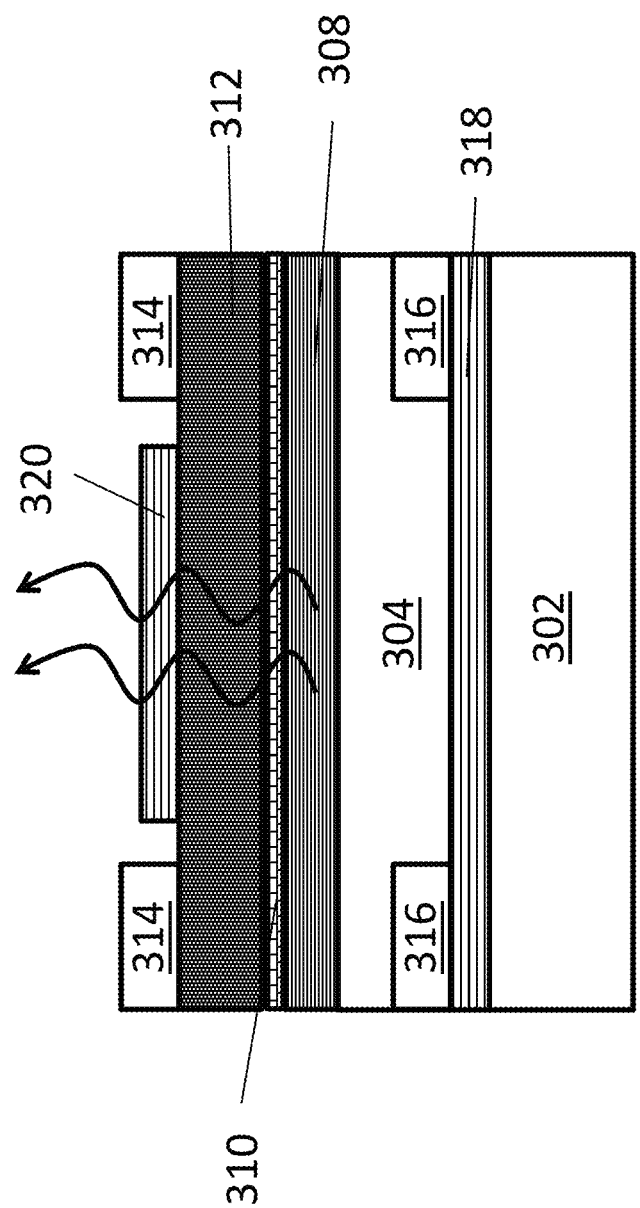
FIG. 3 is a schematic diagram of a vertical cavity surface emitting laser that includes lower and upper distributed Bragg reflectors.

The light-emitting devices can also be vertical cavity surface emitting lasers (VCSELs). One embodiment of a VCSEL that incorporates an MQW pin diode structure is depicted in FIG. 3. The VCSEL includes a substrate 302 an electron injection layer 304 comprising an n-type doped semiconductor material. Active region 308 comprising a MQW structure is disposed on electron injection layer 304 and a layer of current tunneling material 310 is disposed on active region 308. A p-type doped layer of semiconductor material provides the hole injection layer 312 and completes the pin diode structure. An anode 314 and a cathode 316 are placed in electrical communication with the hole and electron injection layers, respectively. The VCSEL further includes a lower distributed Bragg reflector (DBR) 318 sandwiched between the substrate and the cathode and an upper DBR 320 disposed over p-type doped hole injection layer 312.

Figure 4:
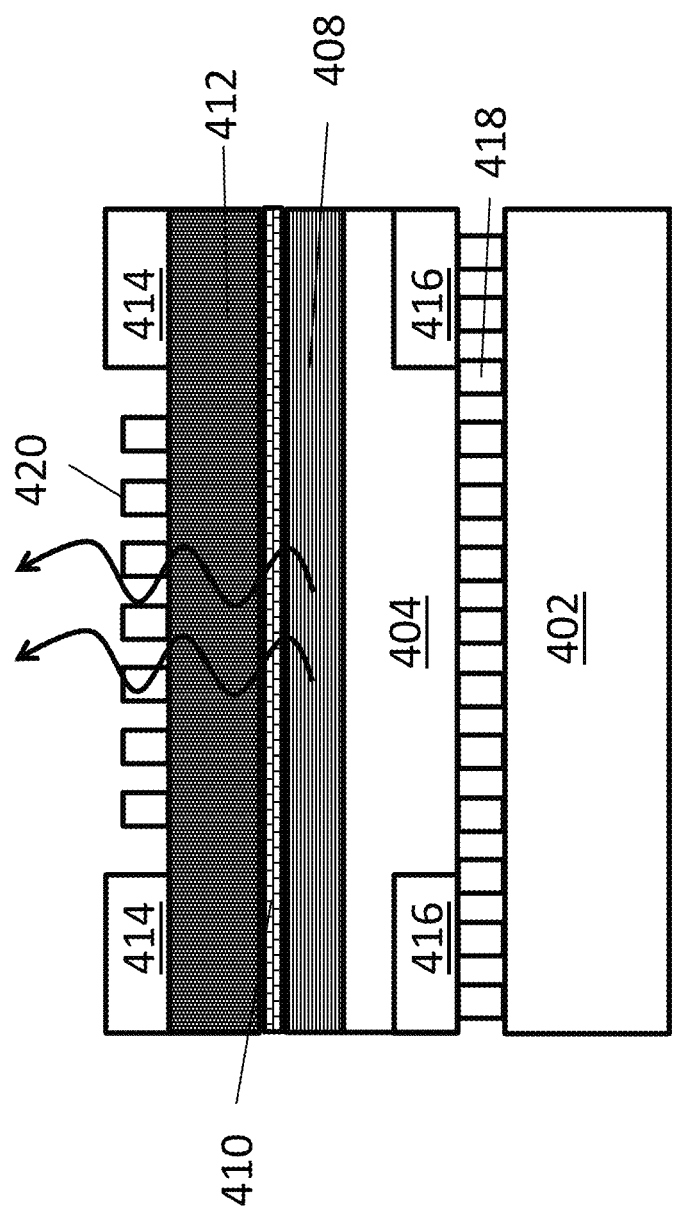
FIG. 4 is a schematic diagram of a vertical cavity surface emitting laser that includes lower and upper photonic crystal reflectors.

Another embodiment of a VCSEL is depicted in FIG. 4. As in the VCSEL shown in FIG. 3, this VCSEL includes a substrate 402 an electron injection layer 404 comprising an n-type doped semiconductor material. Active region 408 comprising a MQW structure is disposed on electron injection layer 404 and a layer of current tunneling material 410 is disposed on active region 408. A p-type doped layer of semiconductor material provides the hole injection layer 412 and completes the pin diode structure. An anode 414 and a cathode 416 are placed in electrical communication with the hole and electron injection layers, respectively. The VCSEL further includes a lower photonic crystal reflector 418 sandwiched between the substrate and the cathode and an upper photonic crystal reflector 420 disposed over p-type doped hole injection layer 412.

Although the upper and lower reflectors in the VCSELs of FIG. 3 and FIG. 4 are of the same type, different types of reflectors can be used in the same device. For example, a photonic crystal type reflector can be used as the lower reflector and a DBR can be used as the upper reflector, or vice versa. The reflectors in the VSCELs can be formed by epitaxial growth or by transfer and bonding. Methods for transferring and bonding a photonic crystal type reflector to the active region of a VCSEL are described in U.S. Pat. No. 8,217,410.

Figure 5:
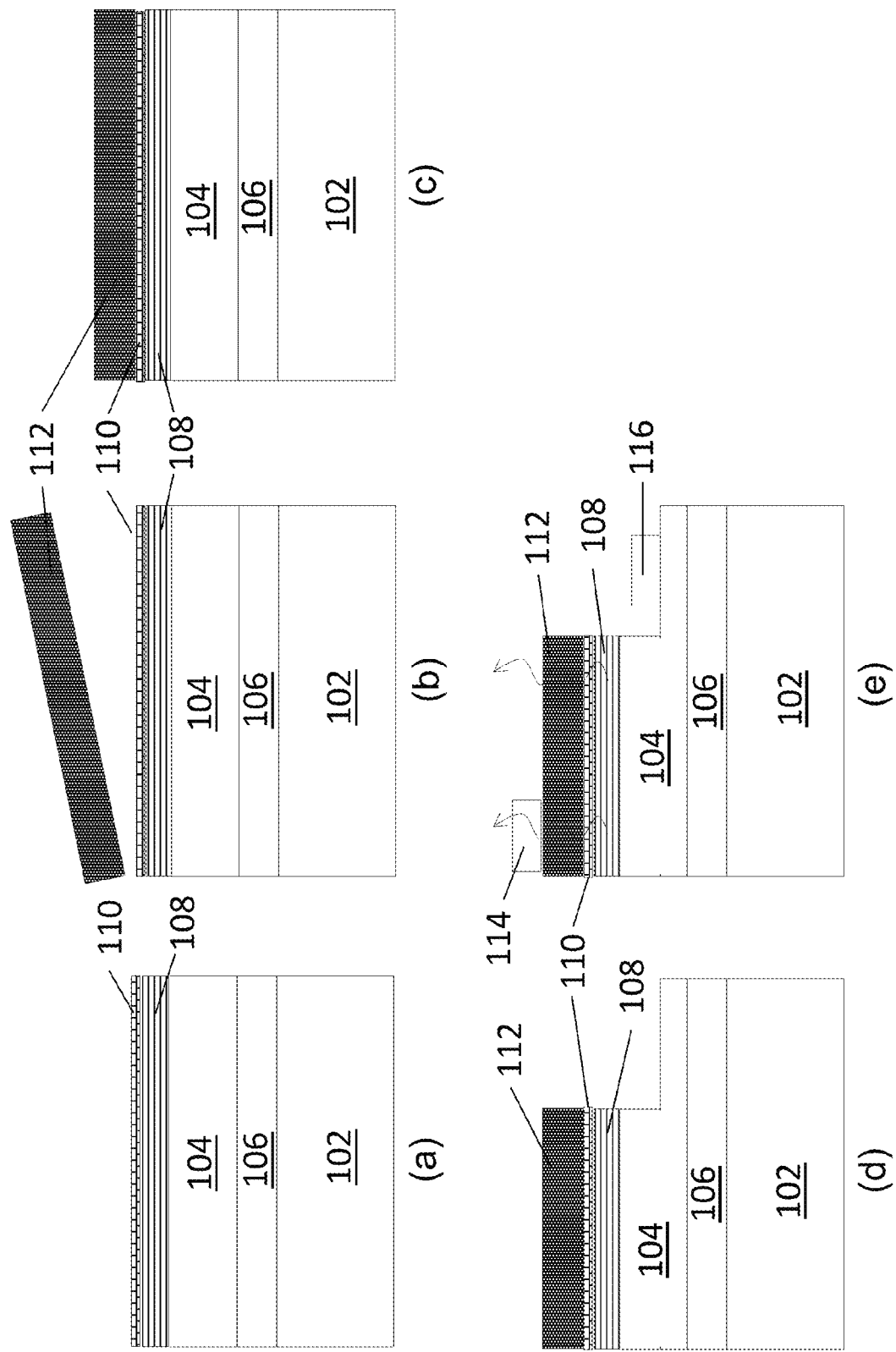
FIG. 5 is a schematic diagram showing the processing steps of a transfer and bonding method for making a light-emitting diode of the type shown in FIG. 1.

The thin film transfer and bonding processes and the current tunnel layer deposition process used to form the MQW pin diode structure in an LED are illustrated in FIG. 5. Panel (a) in FIG. 5 shows a heterostructure that includes substrate 102, buffer layer 106, n-type doped semiconductor layer 104, active region 108 and current tunneling layer 110. Semiconductor layers 104-108 can be grown epitaxially on growth substrate 102 using known methods, such as molecular beam epitaxy (MBE). Current tunnel layer 110 can be deposited onto the upper surface of active region 108 using, for example, atomic layer deposition (ALD).

The thickness of the current tunneling layer typically need only be on the order of the root mean square (rms) roughness of the surfaces of the layers of semiconductor material which it binds. By way of illustration, in some embodiments, the current tunneling layer has a thickness in the range from about 0.5 to about 10 nm. This includes embodiments in which it has a thickness in the range from about 0.5 to about 10, from about 0.5 to about 5 nm or from about 0.5 to about 3 nm. Since the thickness of the current tunneling layer may not be uniform on an atomic scale, the thickness of the layer corresponds to the average thickness of the layer across the bonding interfaces of the heterostructure.

Once the current tunneling layer is formed, a layer of pre-formed, single-crystalline, p-type doped semiconductor material 112 can be placed on its upper surface to provide the p-layer of the pin diode structure, as shown in panel (b). The bonding between the transferred layer of single-crystalline p-type doped semiconductor material and the current tunneling layer can be enhanced by annealing (panel (c)). Next, a mesa is etched into pin diode structure (panel (d)) and anode 114 and cathode 116 are deposited using, for example, metallization (panel (e)).

Figure 6:
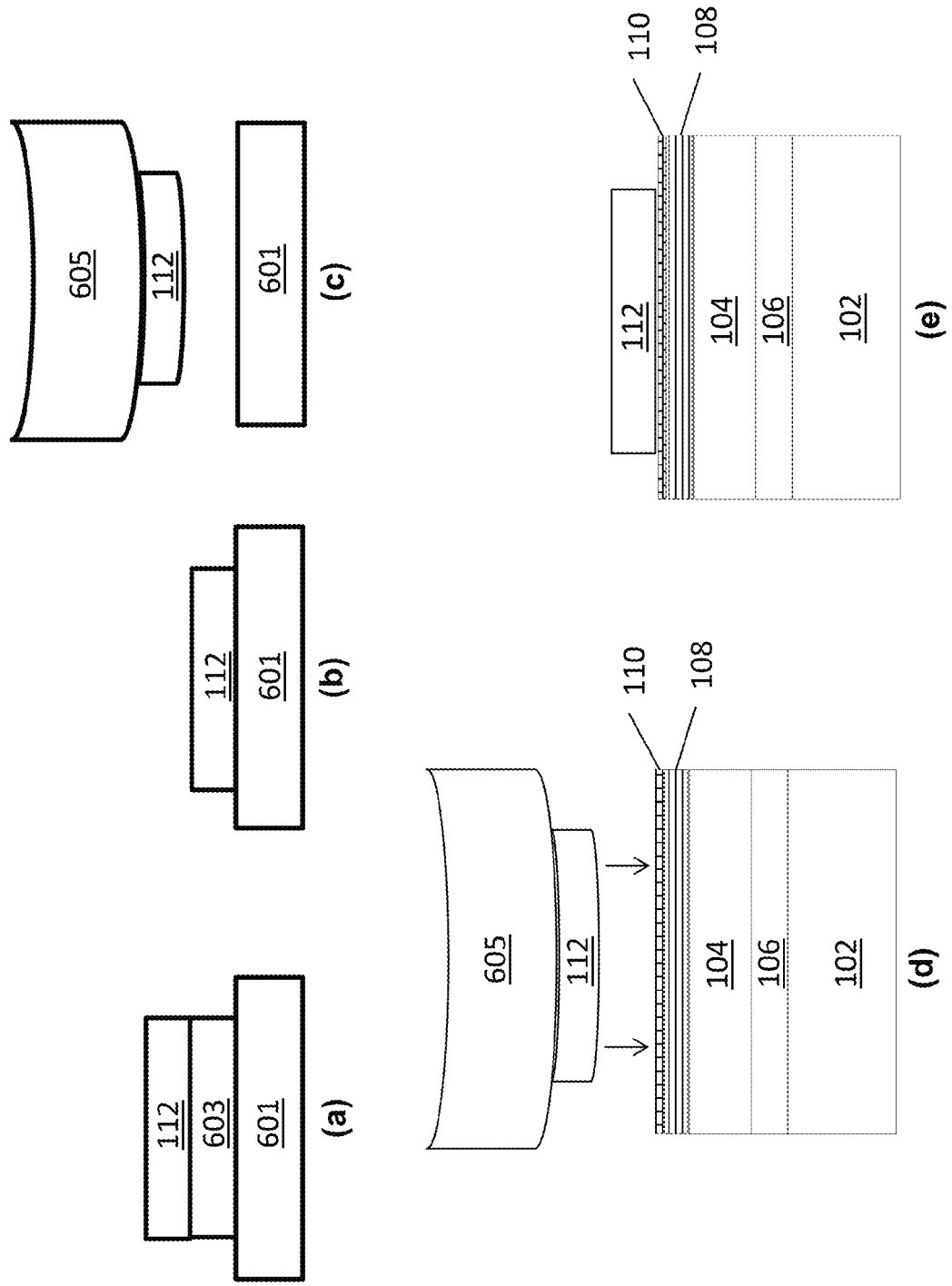
FIG. 6 is a schematic diagram showing a method for transferring a layer of single-crystalline doped semiconductor onto the current tunneling layer of a heterostructure using a thin film release and transfer method.

FIG. 6 illustrates in greater detail a method of transferring a pre-formed single-crystalline p-type doped semiconductor layer onto the current tunneling layer. The method begins with a semiconductor-on-insulator substrate (panel (a)) comprised of a handle wafer 601, such as a Si handle wafer, a buried oxide layer 603 and a thin layer of a p-type doped single-crystalline semiconductor 112, such as a thin layer of single-crystalline p-type Si, Ge, GaAs or InGaAs. Buried oxide layer 603 is selectively removed from the structure using, for example, a selective chemical etchant. As a result, layer 112 settles onto underlying handle wafer 601, as shown in panel (b). A host material 605, such as a rubber stamp, is then pressed onto the upper surface of layer 112. Layer 112 adheres to host material 605 and is lifted away from handle wafer 601 (panel (c)). In a subsequent step (panel (d)) released layer 112 is brought into contact with, and transferred onto, current tunneling layer 110. The single-crystalline layers can be doped before or after transfer and bonding. Host material 605 is then removed (panel (e)), leaving an MQW pin structure.

Figure 7:
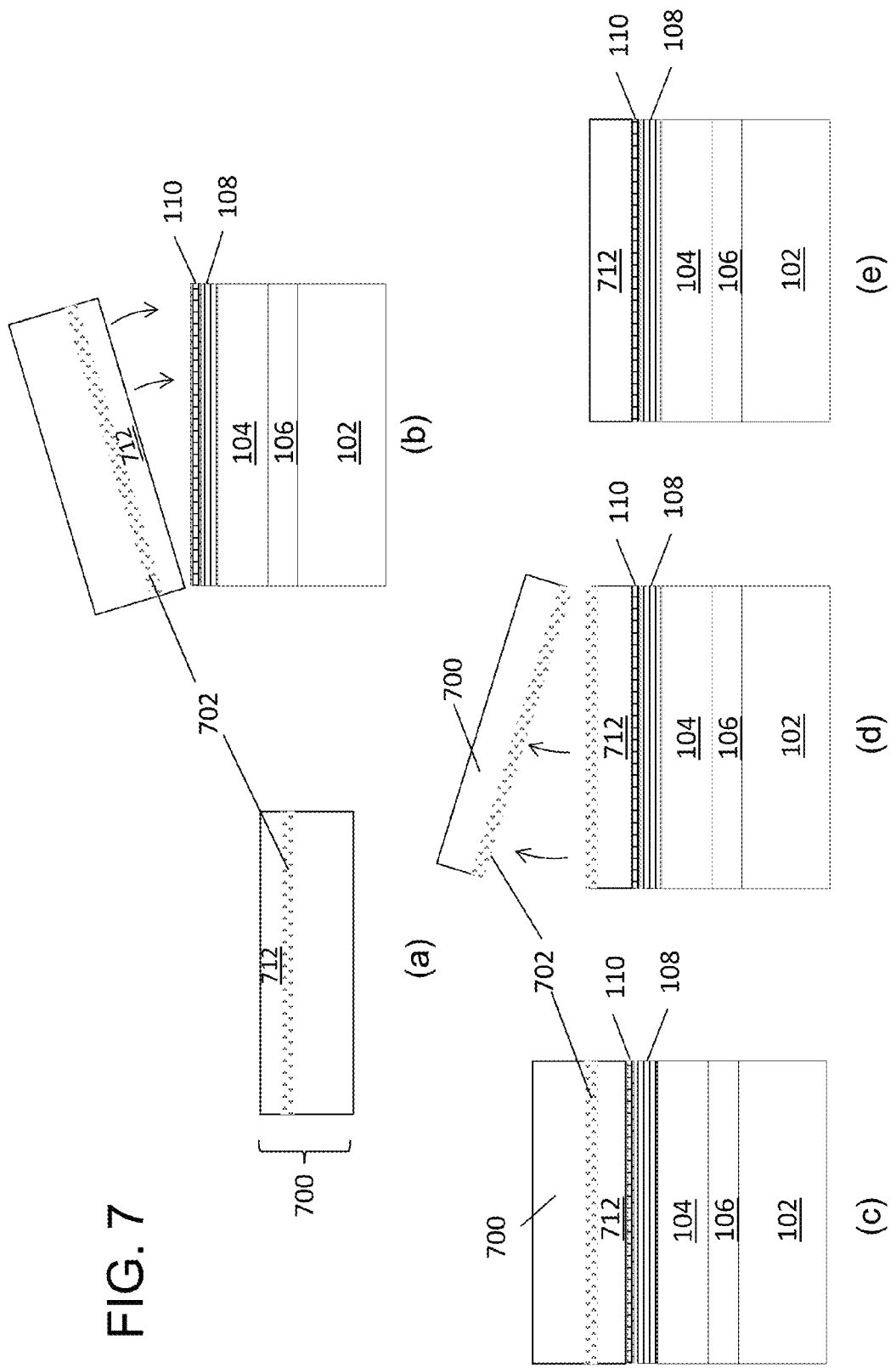
FIG. 7 is a schematic diagram showing a method for transferring a layer of single-crystalline doped semiconductor onto the current tunneling layer of a heterostructure using a wafer bonding and cleaving method.

FIG. 7 illustrates an alternative method of transferring a single-crystalline p-type doped semiconductor layer onto the current tunneling layer using wafer bonding followed by hydrogen implantation to create a splitting plane in the semiconductor material—a technique that is sometime referred to as Smart Cut. A description of the Smart Cut process can be found in Bruel et al., *Proceedings* 1995 *IEEE International SOI Conference,* 178 (1995). In this technique, a buried hydrogen implantation layer 702 is formed in a p-type doped semiconductor substrate 700, such as a semiconductor wafer, as shown in panel (a). The depth of hydrogen implantation layer 702 will determine the thickness of the single-crystalline p-type doped semiconductor layer 712 to be transferred. Once the splitting plane is formed via hydrogen implantation, the surface of substrate 700 is contacted with current tunneling layer 110 (panels (b) and (c)). Substrate 700 is then split at hydrogen implantation layer 702 and the bulk of substrate 700 is removed (panel (d)) to form the MQW pin diode structure (panel (e)). If light from the active layer is to be emitted through single-crystalline p-type doped semiconductor layer 712, that layer may be thinned using a post-transfer chemical mechanical polish.

Figure 8:
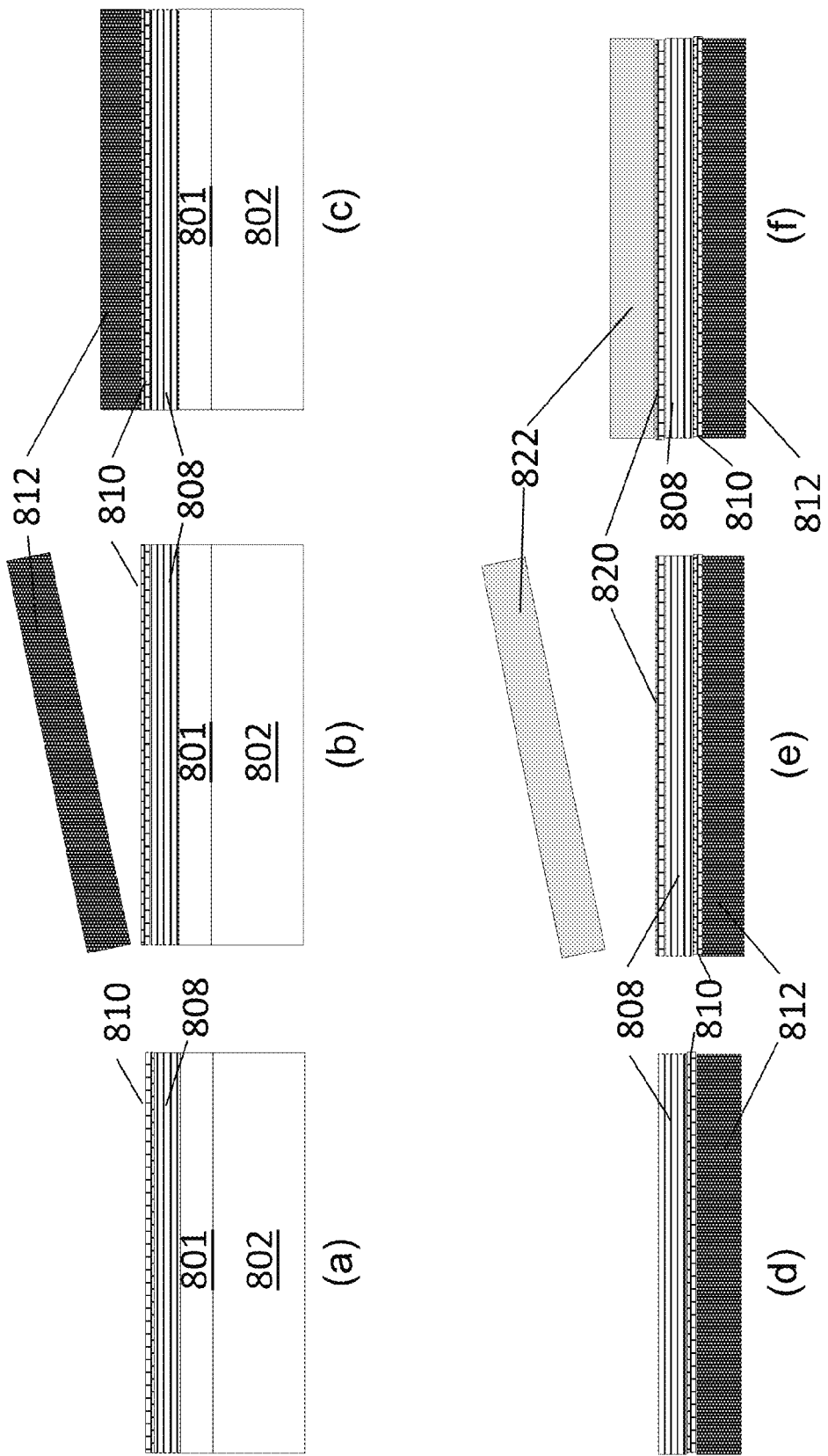
FIG. 8 is a schematic diagram showing the processing steps of a transfer and bonding method for making a pin diode heterojunction that include two current tunneling layers.

FIGS. 1-5 illustrate embodiments of light-emitting devices having a single current tunneling layer sandwiched between the active region and the p-type doped hole injection layer of the pin heterojunction structure. However, in other devices a single current tunneling layer can be disposed between the active region and the n-type doped electron injection layer. Alternatively, a device can include a first current tunneling layer between the active region and the p-type doped hole injection layer and a second current tunneling layer between the active region and the n-type doped electron injection region. FIG. 8 is a schematic diagram illustrating a method of forming a MQW pin diode structure that has two current tunneling layers.

Panel (a) in FIG. 8 shows a heterostructure that includes substrate 802, active region 808 and current tunneling layer 810. A buffer layer 801 is present between substrate 802 and active region 808. The active region and any buffer layers can be grown epitaxially on growth substrate 802 using known methods, such as molecular beam epitaxy (MBE). Current tunneling layer 810 can be deposited onto the upper surface of active region 808 using, for example, atomic layer deposition (ALD). Once current tunneling layer 810 is formed, a layer of pre-formed, single-crystalline, p-type semiconductor material 812 can be placed on its upper surface to provide the p-layer of the pin diode structure, as shown in panel (b). The bonding between the transferred layer of single-crystalline p-type doped semiconductor material and current tunneling layer 812 can be enhanced by annealing (panel (c)). Substrate 802 is then removed using, for example, a chemical mechanical polish and/or selective etch (panel (d)). A second current tunneling layer 820 is then deposited on the surface of active region 808, opposite the first current tunneling layer 810, and a layer of pre-formed, single-crystalline, n-type doped semiconductor material 822 is placed on its upper surface to provide the n-layer of the pin diode structure (panel (e)). The bonding between the transferred layer of single-crystalline n-type doped semiconductor material and current tunneling layer 822 can be enhanced by annealing (panel (f)).

In some embodiments, the inorganic material of the current tunneling layer is an oxide. In such embodiments, the oxide can comprise, consist of, or consist essentially of, a metal oxide, an oxide of a semiconductor element or an oxide of a metalloid element. Examples of oxides that may be used in metal oxide current tunneling layers include, but are not limited to, those that can be deposited via atomic layer deposition (ALD). Examples of such metal oxides include aluminum oxide ($Al_2O_3$), titanium oxide ($TiO_2$), hafnium oxide ($HfO_2$), tantalum oxide ($Ta_2O_5$), and silicon dioxide ($SiO_2$). In some embodiments, the metal, semiconductor or metalloid elements present in the oxide are different from any metal, semiconductor or metalloid elements in the other semiconductor layers with which they are in contact and between which they are disposed. In the present heterostructures, the inorganic oxides of the current tunneling layers are not native oxides of either of the two semiconductor materials in the layers that they separate. (As used herein, the term native oxide refers to an oxide that would be monolithically formed on the semiconductor material as the result of the oxidation of the material in an oxygen-containing environment. For example, $SiO_2$ is a native oxide of Si.)

In other embodiments, the inorganic material of the current tunneling layer is a nitride. In such embodiments, the nitride can comprise, consist of, or consist essentially of, a metal nitride, nitride of a semiconductor element or a nitride of a metalloid element. Examples of nitrides that may be used in nitride current tunneling layers include, but are not limited to, those that can be deposited via atomic layer deposition (ALD). Examples of such nitrides include aluminum nitride, silicon nitride, and titanium nitride. In some embodiments, the metal, semiconductor or metalloid elements present in the nitride are different from any metal, semiconductor or metalloid elements in the semiconductor layers with which they are in contact and between which they are disposed.

In some embodiments, the current tunneling layer comprises two or more sub-layers, each of which comprises an inorganic material, provided, however, that the total combined thickness of the sub-layers is still low enough to allow for the tunneling of electrons and holes through the layer. For example, in a current tunneling layer comprising multiple sub-layers of inorganic oxides, the inorganic oxides can be selected such that one oxide passivates one of the two neighboring semiconductor materials, while another oxide passivates the other of the two neighboring semiconductor materials.

The single-crystalline semiconductor materials of the hole injection layer, the electron injection layer, the MQW structure and any spacer layers are inorganic semiconductors. The semiconductor materials in neighboring layers (i.e., in layers separated by an intervening current tunneling layer) are dissimilar, such that there is a band offset in the electronic energy band diagram of the heterojunctions formed by the two materials. The semiconductor materials can be independently selected from a broad range of semiconductors including: (a) group IV semiconductors; (b) group III-V semiconductors; and (c) group II-VI semiconductors. The semiconductor materials of neighboring layers may be selected from the same group or may be selected from different groups. For example, in an embodiment where the p-type doped semiconductor material is a layer of a group IV semiconductor, the layers of intrinsic semiconductor material that make up the active region (e.g., the well and barrier layers of the MQW structure and spacer layers) and the n-type doped semiconductor material of the electron injection layer can be layers of group III-V or group II-VI semiconductors. Similarly, in an embodiment where the layer of p-type doped semiconductor material is a layer of a group III-V semiconductor, the layers of intrinsic semiconductor material can be layers of a group IV or a group II-VI semiconductor. The group IV semiconductors include elemental semiconductors (e.g., Si, Ge and C, including diamond), as well as alloy and compound semiconductors (e.g., SiGe:C, SiGe, SiGeSn and SiC). The group III-V and group II-VI semiconductors include binary, ternary and higher compound semiconductors. Examples of group III-V semiconductors include GaAs, AlGaAs, InGaAs, AlAs, InAlAs, InP, GaInP, GaP, GaN, InGaN, InAlN, AlN and AlGaN. Examples of group II-VI semiconductors include oxides, such as ZnO.

Each layer of semiconductor material can be characterized by an upper surface, a lower surface and a circumferential edge surface. (The terms "upper" and "lower" are not used to designate any absolute orientation. Rather they are merely intended to refer to the oppositely facing surfaces that run parallel to (including substantially parallel to) a plane laterally bisecting the layer.) In some embodiments, the root mean square (rms) roughness of the upper and/or lower surfaces may be significantly higher than would be considered acceptable for void-free wafer bonding. Thus, in some embodiments, the upper and/or lower surfaces have an rms roughness of greater than 1 nm. This includes embodiments in which the upper and/or lower surfaces have an rms roughness of at least 1 nm (e.g., in the range from 1 nm to 5 nm) and further includes embodiments in which the upper and/or lower surfaces have an rms roughness of at least 5 nm (e.g., in the range from 5 nm to 10 nm). For the purposes of determining the rms roughness of a surface, it can be determined from an AFM image over the area of the interface between the layer of single-crystalline semiconductor material and the current tunneling layer.

Neighboring layers of the heterojunctions that are fabricated using the transfer and bonding process do not have an epitaxial structure. As used herein the term "epitaxial structure" refers to a structure in which the crystallographic orientation of an overlying layer is determined by (matches) that of its underlying layer, such that the two layers have the same crystallographic orientation, at least in the area of their interface. Such epitaxial structures may include strains and stresses at the interface, induced by a lattice mismatch between the two materials and may even include misfit dislocations. In contrast to such epitaxial structures, non-epitaxial layers in the present structures have crystallographic orientations that are independent from (e.g., different from) those of their neighboring layers. As such, the layers that do not have an epitaxial structure are free of lattice mismatch-induced strains or stresses and lattice mismatch-induced misfit dislocations. In fact, the semiconductor materials selected for one or both of the charge injection layers and the intrinsic semiconductor materials selected for the active region may have a lattice constant mismatch that would render them unsuitable for epitaxial growth—even in the presence of an intermediate buffer layer. For example, in some embodiments the lattice constant mismatch between the semiconductor material of one or both of the charge injection layers and the semiconductor material of the active region is greater than about 15%.

The semiconductor materials selected for one or both of the charge injection layers and the semiconductor materials of the active region may have a coefficient of thermal expansion mismatch that would render them unsuitable for wafer bonding, which is typically carried out at very high temperatures. This is due, at least in part, to the presence of the current tunneling layer. The current tunneling layer can act as a buffer to the thermal expansion differences between the two single-crystalline semiconductor materials and can be used to bond two single-crystalline semiconductor materials at processing temperatures lower than those used in wafer bonding processing techniques.

The thicknesses of the layers of single-crystalline semiconductor materials will depend on the intended light-emitting device application. However, by way of illustration, in some embodiments of the devices, some or all of the layers of single-crystalline material have thicknesses of no greater than about 1000 nm. If the semiconductor materials of the charge injection layers absorb radiation within the emission wavelength range of the active region, it is advantageous to use a very thin layer of the material. For example, the p-type and/or n-type doped semiconductor layers may be thinned to a thickness of 10 nm or less, including thicknesses of 5 nm or less.

The wavelengths of the radiation emitted by the light-emitting devices will depend on the semiconductor materials used in the active region. Thus, with the proper selection of materials, the light-emitting devices can be configured to emit in the ultraviolet (UV; from ~100 to 400 nm, including 220 to 240 nm), visible (vis; from 400 to 780 nm) and/or infrared (IR; from 780 nm to 1 mm; e.g., 1.55 µm) regions of the electromagnetic spectrum. By way of illustration, a light-emitting device designed to emit light in the wavelength range from about 220 to 240 nm could employ an active region having an MQW structure comprising alternating layers of single-crystalline AlGaN quantum well layers and single-crystalline AlN barrier layers. This active region can be grown epitaxially over an n-type AlGaN electron injection layer. Alternatively, a light-emitting device designed to emit light at a wavelength of about 1.55 µm could employ an active region having an MQW structure comprising alternating layers of single-crystalline InGaP quantum well layers and single-crystalline InGaP barrier layers, wherein the quantum well layers and barrier layers have different elemental ratios. This active region can be grown epitaxially over an n-type InP electron injection layer. A light-emitting device designed to emit blue light could employ an active region having an MQW structure comprising alternating layers of single-crystalline InGaN quantum well layers and single-crystalline GaN barrier layers. This active region can be grown epitaxially over an n-type GaN electron injection layer. Other combinations of materials the can be used in the active region and the electron injection layer are listed in Table 1.

TABLE 1

Example Materials for Quantum Well, Barrier and Electron Injection Layers.

| Wavelength [nm] | Material |
|---|---|
| Infrared | Gallium arsenide (GaAs) |
| | Aluminum gallium arsenide (AlGaAs) |
| | Aluminum gallium indium arsenide (AlGaInAs) |
| | Gallium indium arsenide antimony (GaInAsSb) |
| | Indium gallium arsenide phosphide (InGaAsP) |
| Red | Aluminum gallium arsenide (AlGaAs) |
| | Gallium arsenide phosphide (GaAsP) |
| | Aluminum gallium indium phosphide (AlGaInP) |
| | Gallium(III) phosphide (GaP) |
| Orange | Gallium arsenide phosphide (GaAsP) |
| | Aluminum gallium indium phosphide (AlGaInP) |
| | Gallium(III) phosphide (GaP) |
| Yellow | Gallium arsenide phosphide (GaAsP) |
| | Aluminum gallium indium phosphide (AlGaInP) |
| | Gallium(III) phosphide (GaP) |
| Green | Traditional green: |
| | Gallium(III) phosphide (GaP) |
| | Aluminum gallium indium phosphide (AlGaInP) |
| | Aluminum gallium phosphide (AlGaP) |
| | Pure green: |
| | Indium gallium nitride (InGaN)/Gallium(III) nitride (GaN) |
| Blue | Zinc selenide (ZnSe) |
| | Indium gallium nitride (InGaN) |
| Violet | Indium gallium nitride (InGaN) |
| Purple | Dual blue/red LEDs, |
| | blue with red phosphor, |
| | or white with purple plastic |
| Ultraviolet | Diamond (235 nm) |
| | Boron nitride (215 nm) |
| | Aluminum nitride (AlN) (210 nm) |
| | Aluminum gallium nitride (AlGaN) |
| | Aluminum gallium indium nitride (AlGaInN) - down to 210 nm |
| Pink | Blue with one or two phosphor layers: |
| | yellow with red, orange or pink phosphor added afterwards, |
| | or white phosphors with pink pigment or dye over top. |
| White | Blue/UV diode with yellow phosphor or red, green and blue phosphors. |

Suitable doped semiconductors for in the charge injection layers in the light-emitting devices include doped Si, Ge, GaAs and InP.

EXAMPLES

Example 1

Si/GaN Hybrid Blue LED Fabrication

The fabrication process for a Si—GaN hybrid LED began with the growth of undoped InGaN/GaN multiple quantum well (MQWs) layers and a GaN n-layer on a sapphire substrate. The InGaN/GaN i-n layer structure was grown using a metalorganic chemical vapor deposition (MOCVD) system. The structure was composed of a 1.0 µm thick undoped-GaN buffer layer, 2 µm thick Si doped n-GaN (n=3×10$^{18}$ cm$^{-3}$), and five pairs of In$_{0.2}$Ga$_{0.8}$N/GaN (2 nm/8 nm) MQW active layers. The MQW structure was designed to achieve a desired emission wavelength between 450 nm and 470 nm. Then, a thin aluminum oxide layer as a current tunneling layer was deposited on top of the MQWs using an atomic layer deposition (ALD) system. Prior to the oxide deposition, the InGaN/GaN structure was immersed in a diluted ammonium hydroxide acid solution (DI water: $NH_4OH=10:1$) for 10 min and then rinsed in a deionized (DI) water rinse to obtain a native oxide-free surface.

As a p-type layer, a heavily doped Si layer (doped by ion implantation and diffused to achieve a high boron concentration) was prepared from the top silicon layer of a silicon-on-insulator substrate using photolithography and reactive ion etching (RIE, Unaxis 790) to etch holes through the doped silicon layer. The doped Si layer was then released from the substrate by undercutting it with concentrated hydrofluoric acid (HF, 49%). The released Si layer, which would serve as the p-type layer in the pin structure, was transfer printed onto the current tunneling layer-coated InGaN/GaN substrate. As a result, a very clean Si-aluminum oxide-InGaN interface was achieved. In order to enhance the bonding between the transfer-printed Si layer and the InGaN/GaN substrate, an annealing process was carried out under a $N_2$ ambient using a rapid thermal anneal (RTA) system. A ring shape anode, composed of Ti/Au layer stacks, for the p+Si layer was deposited by electron beam-evaporation. The inside of the ring shape (the active area), through which light would be emitted, was covered by a photoresist to protect it during the entire etching process. The Si layer was then etched by reactive ion etching (RIE), until the oxide tunneling layer was exposed, while the ring shaped active region was left intact due to the photoresist. After the Si layer was completely etched, the current tunneling layer, which acted as an etching stop layer, was removed by a short time wet etching with diluted hydro fluoride (HF, 1:20=HF:DI water) for a few seconds. Then, the ~800 nm deep InGaN/GaN MQWs and n-type GaN were etched using inductively coupled plasma reactive ion etching (ICP-RIE, PlasmaTherm 770 ICP) to expose the n-GaN layer. After etching to the n-GaN layer, Ni/Au stacks for the n-GaN were deposited to provide ohmic contacts, followed by annealing the sample at 500° C. for 1 min using an RTA to enhance the ohmic property.

The electrical (I-V) and optical (EL) characteristics were measured by a 4155B Agilent semiconductor parameter analyzer and a spectrometer (USB 2000, Ocean Optics), respectively.

Example 2

Si/AlN Hybrid UV LED Fabrication

The fabrication process for a Si—AlN hybrid LED began with the growth of undoped AlGaN/AlN multiple quantum well (MQWs) layers and an AlGaN n-layer on an AlN substrate. The c-plane InGaN/GaN i-n layer structures were all grown using a metalorgainic chemical vapor deposition (MOCVD) system. The MQW structure was composed of a 400 nm thick AlN undoped homoepi layer and a 600 nm thick n-type $Al_{0.8}Ga_{0.2}N$ layer, with 2 nm thick $Al_{0.65}Ga_{0.35}N$ QW's and 3 nm thick AlN barriers. Before a p-type Si layer was transfer printed onto the AlGaN/AlN MQW top layer, a thin aluminum oxide layer as a current tunneling layer was deposited on top of the MQWs using an atomic layer deposition (ALD) system. Prior to the oxide deposition, the AlGaN/AlN structure was immersed in a diluted ammonium hydroxide acid solution (DI water: $NH_4OH=10:1$) for 10 min and then rinsed in a deionized (DI) water rinse to obtain a native oxide-free surface.

As a p-type layer, a heavily doped Si layer (doped by ion implantation and diffused to achieve a high boron concentration) was prepared from the top silicon layer of a silicon-on-insulator substrate using photolithography and reactive ion etching (RIE, Unaxis 790) to etch holes through the doped silicon layer. The doped Si layer was then released from the substrate by undercutting it with concentrated hydrofluoric acid (HF, 49%). The released Si layer, which would serve as the p-type layer in the pin structure, was transfer printed onto the current tunneling layer-coated AlGaN/AlN substrate using an elastomeric stamp (PDMS) without any adhesive. As a result, a very clean Si-aluminum oxide-AlN interface was achieved. In order to enhance the bonding between the transfer-printed Si layer and the AlGaN/AlN substrate, an annealing process was carried out under a $N_2$ ambient using a rapid thermal anneal (RTA) system. A ring shaped anode, composed of Ti/Au layer stacks, for the p+Si layer was deposited by electron beam-evaporation. The inside of the ring shape (the active area), through which light would be emitted, was covered by a photoresist to protect it during the entire etching process. The Si layer was then etched by reactive ion etching (RIE), until the tunneling layer was exposed, while the ring shape active region was left intact due to the photoresist. After the Si layer was completely etched, the current tunneling layer, which acted as an etching stop layer, was removed by a short time wet etching with diluted hydro fluoride (HF, 1:20=HF:DI water) for a few seconds. Then, ~260 nm deep AlGaN/AlN MQWs and n-type AlN were etched using inductively coupled plasma reactive ion etching (ICP-RIE, PlasmaTherm 770 ICP) to expose the n-AlGaN layer. After etching to the n-AlGaN layer, Ni/Au stacks for the n-AlGaN were deposited to provide ohmic contacts, followed by annealing the sample at 500° C. for 1 min using an RTA system to enhance the ohmic property.

The electrical (I-V) and optical (EL) characteristics were measured by a 4155B Agilent semiconductor parameter analyzer and a spectrometer (USB 2000, Ocean Optics), respectively.

Example 3

Si/InGaAsP Hybrid NIR LED Fabrication

The fabrication process for a Si—InGaAsP hybrid LED began with the growth of undoped InGaAsP multi quantum well (MQWs) layers on a InP substrate. The InGaAsP MQWs, which were composed of undoped 7.5 nm thick 8 pairs of $In_{0.485}Ga_{0.515}As_{0.83}P_{0.17}$ QWs and $In_{0.76}Ga_{0.24}As_{0.83}P_{0.17}$ barriers, and an InP/InGaAs n-type layer under the MQW layers were grown using a metalorgainic chemical vapor deposition (MOCVD) system. The MQW structure was designed to achieve a desired emission wavelength between 1550 nm and 1560 nm. Before the heavily doped p-type Si layer was transfer printed on top of the InGaAsP MQWs, a thin aluminum oxide layer as a current tunneling layer was deposited using an atomic layer deposition (ALD) system. Prior to the oxide deposition, the sample was immersed in a buffered oxide etch (BOE) solution for 1 min and then rinsed in a deionized (DI) water rinse to obtain a native oxide-free surface.

As a p-type layer, a heavily doped Si layer (doped by ion implantation and diffused to achieve a high boron concentration) was prepared from the top silicon layer of a silicon-on-insulator substrate using photolithography and reactive ion etching (RIE, Unaxis 790) to etch holes through the doped silicon layer. The doped Si layer was then released from the substrate by undercutting it with concentrated hydrofluoric acid (HF, 49%). The released Si layer, which would serve as the p-type layer in the pin structure, was transfer printed onto the current tunneling layer-coated InGaAsP/InGaAs/InP substrate. As a result, a very clean Si-aluminum oxide-InGaAsP interface was achieved. In order to enhance the bonding between the transfer-printed Si layer and the InGaAsP/InGaAs/InP substrate, an annealing process was carried out under a $N_2$ ambient using a rapid thermal anneal (RTA) system. A ring shape anode, composed of Ti/Au layer stacks, for the p+Si layer was deposited by electron beam-evaporation. The inside of the ring shape (the active area), through which light would be emitted, was covered by a photoresist to protect it during the entire etching process. The Si layer was then etched by reactive ion etching (RIE), until the tunneling layer was exposed, while the ring shape active region was left intact due to the photoresist. After the Si layer was completely etched, the current tunneling layer, which acted as an etching stop layer, was removed by a short time wet etching with diluted hydro fluoride (HF, 1:20=HF:DI water) for a few seconds. Then, the ~250 nm deep i-n InGaAsP/InP/InGaAs layers were etched by inductively coupled plasma reactive ion etching (ICP-RIE, PlasmaTherm 770 ICP) to expose the n-InGaAs layer. Ti/Pd/Ti/Au metal stacks were deposited and annealed at 350° C. for 30 sec using a rapid thermal annealing (RTA) system to achieve the ohmic contact.

The electrical (I-V) and optical (EL) characteristics were measured by a 4155B Agilent semiconductor parameter analyzer and a spectrometer (USB 2000, Ocean Optics), respectively.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A light-emitting device comprising:
a hole injection layer comprising a single-crystalline p-type doped semiconductor material;
an electron injection layer comprising a single-crystalline n-type doped semiconductor material;
a light-emitting active region comprising intrinsic semiconductor materials disposed between the hole injection layer and the electron injection layer, the light-emitting active region comprising a multiple quantum well structure comprising alternating barrier layers and quantum well layers; and
a current tunneling layer disposed between, and in contact with, the hole injection layer and the light-emitting active region or between, and in contact with, the electron injection layer and the light-emitting active region, the current tunneling layer comprising an inorganic material having a bandgap that is wider than the bandgaps of the doped semiconductor material and the intrinsic semiconductor material with which it is in contact; wherein the interface between the current tunneling layer and the doped semiconductor material and the interface between the current tunneling layer and the intrinsic semiconductor material do not have an epitaxial structure.

2. The device of claim 1, wherein the inorganic material is an oxide that is not a native oxide of the doped semiconductor material or a native oxide of the intrinsic semiconductor material with which it is in contact.

3. The device of claim 2, wherein the inorganic material is aluminum oxide.

4. The device of claim 1, wherein the inorganic material is a nitride.

5. The device of claim 1, wherein the current tunneling layer is disposed between and in contact with the hole injection layer and the light-emitting active region.

6. The device of claim 5, wherein the p-type doped semiconductor material is a p-type group IV semiconductor or a group III-V semiconductor.

7. The device of claim 6, wherein the p-type group IV semiconductor is p-type silicon.

8. The device of claim 7, wherein the current tunneling layer is a layer of aluminum oxide.

9. The device of claim 6, wherein the p-type group IV semiconductor is p-type germanium.

10. The device of claim 9, wherein the current tunneling layer is a layer of aluminum oxide.

11. The device of claim 6, wherein the intrinsic semiconductor materials are group III-V semiconductor materials.

12. The device of claim 1, wherein the barrier layers are MN layers and the quantum well layers are AlGaN layers.

13. The device of claim 1, wherein the barrier layers are InP layers and the quantum well layers are InGaAs layers.

14. The device of claim 1, wherein the barrier layers are GaN layers and the quantum well layers are InGaN layers.

15. The device of claim 1, wherein the device comprises:
a first current tunneling layer disposed between the hole injection layer and the light-emitting active region, the first current tunneling layer comprising an inorganic material having a bandgap that is wider than the bandgaps of the p-type doped semiconductor material and the intrinsic semiconductor material with which it is in contact, wherein the interface between the first current tunneling layer and the p-type doped semiconductor material and the interface between the first current tunneling layer and the intrinsic semiconductor material do not have an epitaxial structure; and
a second current tunneling layer disposed between and in contact with the electron injection layer and the light-emitting active region, the second current tunneling layer comprising an inorganic material having a bandgap that is wider than the bandgaps of the n-type doped semiconductor material and intrinsic semiconductor material with which it is in contact, wherein the interface between the second current tunneling layer and the n-type doped semiconductor material and the interface between the second current tunneling layer and the intrinsic semiconductor material do not have an epitaxial structure.

16. The device of claim 15, wherein the p-type doped semiconductor material is a p-type doped group IV semiconductor, the n-type doped semiconductor material is an n-type doped group IV semiconductor and the intrinsic semiconductor materials are intrinsic group III-V semiconductors.

17. The device of claim 16, wherein the inorganic material is an oxide that is not a native oxide of the doped semiconductor materials or a native oxide of the intrinsic semiconductor material with which it is in contact.

18. The device of claim 17, wherein the inorganic material is aluminum oxide.

19. The device of claim 17, wherein the inorganic material is a nitride.

20. A method of making a light-emitting device, the method comprising:
- providing a multilayered semiconductor heterostructure comprising:
  - an electron injection layer comprising a single-crystalline n-type doped semiconductor material; and
  - a light-emitting active region comprising intrinsic semiconductor materials on the electron injection layer, the light-emitting active region comprising a multiple quantum well structure comprising alternating barrier layers and quantum well layers;
- depositing a current tunneling layer on the light-emitting active region;
- transferring a hole injection layer comprising single-crystalline p-type doped semiconductor material onto the current tunneling layer; and
- bonding the hole injection layer to the current tunneling layer;
- wherein the current tunneling layer comprises an inorganic material having a bandgap that is wider than the bandgaps of the p-type doped semiconductor material and the intrinsic semiconductor material with which it is in contact;
- and further wherein the interface between the current tunneling layer and the p-type doped semiconductor material and the interface between the current tunneling layer and the intrinsic semiconductor material do not have an epitaxial structure.

* * * * *